US006791139B2

(12) United States Patent
Noro et al.

(10) Patent No.: US 6,791,139 B2
(45) Date of Patent: Sep. 14, 2004

(54) SEMICONDUCTOR MEMORY AND METHOD FOR FABRICATING THE SAME

(75) Inventors: Fumihiko Noro, Kyoto (JP); Seiki Ogura, Wappingers Falls, NY (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 31 days.

(21) Appl. No.: 10/366,481

(22) Filed: Feb. 14, 2003

(65) Prior Publication Data

US 2003/0116789 A1 Jun. 26, 2003

Related U.S. Application Data

(62) Division of application No. 09/942,948, filed on Aug. 31, 2001, now Pat. No. 6,558,997.

(30) Foreign Application Priority Data

Aug. 31, 2000 (JP) ........................................ 2000-262160

(51) Int. Cl.[7] .............................................. H01L 29/76
(52) U.S. Cl. ........................ 257/314; 257/315; 257/382
(58) Field of Search ................................ 257/314, 315, 257/316, 318, 320, 321, 326, 377, 382, 384

(56) References Cited

U.S. PATENT DOCUMENTS 5,034,798 A    7/1991  Ohsima ....................... 257/324
5,442,210 A    8/1995  Kanehachi ................... 257/296
5,587,332 A   12/1996  Chang et al. ................ 365/185
5,656,522 A    8/1997  Komori et al. .............. 438/258
6,037,625 A    3/2000  Matsubara et al. ......... 257/315
6,051,860 A    4/2000  Odanaka et al. ............ 257/316
6,235,583 B1 *  5/2001  Kawata et al. .............. 438/257
6,417,051 B1 *  7/2002  Takebuchi ................... 438/287
6,451,643 B2 *  9/2002  Komori et al. ............. 438/211

FOREIGN PATENT DOCUMENTS

JP          11-251527        9/1999

* cited by examiner

Primary Examiner—Wael M. Fahmy
Assistant Examiner—Hoai Pham
(74) Attorney, Agent, or Firm—McDermott, Will & Emery

(57) ABSTRACT

A semiconductor memory has first and second active regions that have been defined in a semiconductor substrate and electrically isolated from each other. Over the first active region, a control gate electrode has been formed with a control gate insulating film interposed therebetween. A floating gate electrode has been formed adjacent to a side face of the control gate electrode with a capacitive insulating film interposed therebetween. A tunnel insulating film is interposed between the first active region and the floating gate electrode. A gate electrode has been formed over the second active region with a gate insulating film interposed therebetween. Source/drain regions have been defined in respective parts of the second active region beside the gate electrode. Only the source/drain regions and the gate electrode have their upper surface covered with a metal silicide film.

2 Claims, 9 Drawing Sheets

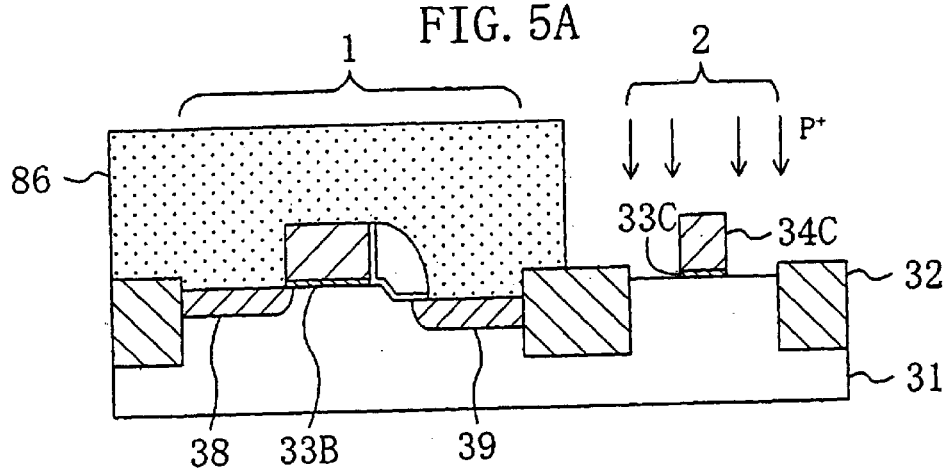
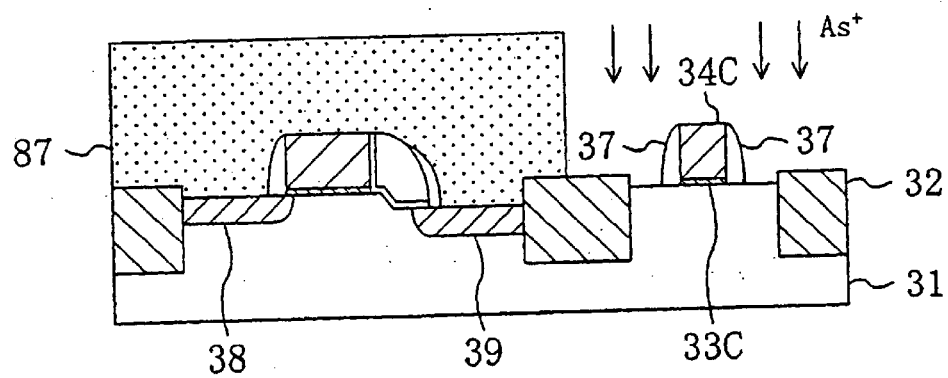
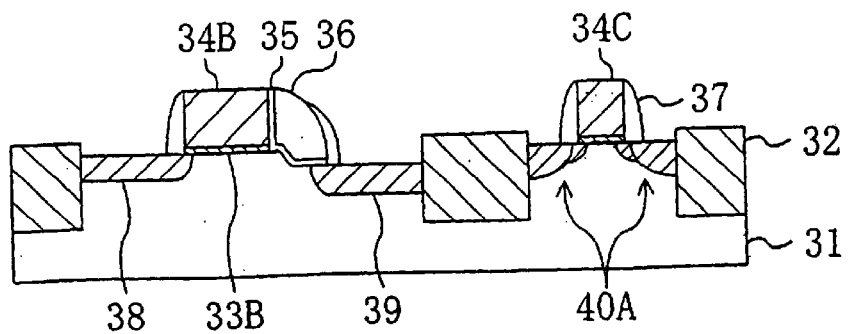

SEMICONDUCTOR MEMORY AND METHOD FOR FABRICATING THE SAME

This application is a divisional of application Ser. No. 09/942,948 filed Aug. 31, 2001 now U.S. Pat. No. 6,558,997.

BACKGROUND OF THE INVENTION

The present invention relates to a semiconductor memory implementable as a split-gate EEPROM, in which the control and floating gates of each storage element are formed side by side on a substrate, and also relates to a method for fabricating a memory of that type.

An electrically erasable and programmable read-only memory (EEPROM) with floating gates is known as a typical electrically erasable and programmable nonvolatile semiconductor memory.

Recently, a semiconductor memory should have its size further reduced to realize an even more densely integrated LSI and also has to have its performance further enhanced. A split-gate EEPROM was proposed as a structure that would contribute to such downsizing and performance enhancement greater than any other candidate. This is because a split-gate EEPROM includes a floating gate electrode that is horizontally adjacent to a control gate electrode with a capacitive insulating film interposed therebetween and because the split-gate EEPROM can operate even at a lower supply voltage.

Normally, in writing data on an EEPROM, a high voltage is produced between the drain region and control gate electrode to create hot electrons in part of the channel region near the drain region. Then, those hot electrons are accelerated and injected into the floating gate electrode. To erase data from an EEPROM on the other hand, the charges existing in the floating gate electrode are ejected into the source, drain or channel region by way of the tunnel insulating film.

Hereinafter, a known split-gate semiconductor memory will be described with reference to FIG. 7.

As shown in FIG. 7, the semiconductor memory has memory and logic circuit regions 100 and 200 obtained by partitioning a semiconductor substrate 101 of silicon by an isolation film 102.

On the memory circuit region 100 of the substrate 101, a control gate electrode 104 has been formed with a gate insulating film 103 interposed therebetween. As shown in FIG. 7, the surface of the substrate 101 has a step 101a in the memory circuit region 100. And on the side face of the control gate electrode 104 closer to the step 101a, a floating gate electrode 105 has been formed to cover the step 101a with an insulating film 106 interposed therebetween.

Source/drain regions 107 and 108 have been defined in parts of the substrate 101 beside the control and floating gate electrodes 104 and 105, respectively. Parts of the control and floating gate electrodes 104 and 105 and source/drain regions 107 and 108, which would be exposed otherwise, are covered with a metal silicide film 110.

On the logic circuit region 200 of the substrate 101, a gate electrode 112 has been formed with a gate insulating film 111 interposed therebetween. A sidewall insulating film 113 has been formed on the side faces of the gate electrode 112. Source/drain regions 114 have been defined in parts of the substrate 101 beside the gate electrode 112. And parts of the gate electrode 112 and source/drain regions 114, which would be exposed otherwise, are also covered with the metal silicide film 110.

In the known structure with the memory and logic circuit regions 100 and 200 on one substrate 101, the control and floating gate electrodes 104 and 105, source/drain regions 107, 108 and 114 and gate electrode 112 have their upper surface covered with the metal silicide layer 110 entirely. Accordingly, the devices formed in the memory and logic circuit regions 100 and 200 can operate faster.

In the known memory, however, the control and floating gate electrodes 104 and 105 are adjacent to each other with the extremely thin insulating film 106 interposed therebetween. Thus, when the respective upper surfaces of the control and floating gate electrodes 104 and 105 are silicided, these electrodes 104 and 105 might be short-circuited with each other.

SUMMARY OF THE INVENTION

It is therefore an object of the present invention to further reduce the size of, and further enhance the performance of, a semiconductor memory of a split-gate type including memory and logic circuits on the same substrate.

To achieve this object, according to the present invention, the control and floating gate electrodes for the memory circuit do not have their upper surface silicided.

Specifically, a first inventive semiconductor memory includes: a control gate electrode formed over a first active region of a semiconductor substrate with a control gate insulating film interposed therebetween; and a floating gate electrode formed adjacent to a side face of the control gate electrode and over the first active region. A capacitive insulating film is interposed between the side face of the control gate electrode and the floating gate electrode, while a tunnel insulating film is interposed between the first active region and the floating gate electrode. The memory further includes: first source/drain regions defined in parts of the first active region beside the control and floating gate electrodes, respectively; and a gate electrode formed over a second active region of the substrate with a gate insulating film interposed therebetween. The second active region is electrically isolated from the first active region. The memory further includes second source/drain regions defined in respective parts of the second active region beside the gate electrode. In this memory, only the second source/drain regions and the gate electrode have their upper surface covered with a metal silicide film.

In the first inventive memory, only the second source/drain regions and gate electrode of each logical element in the second active region have their upper surface covered with a metal silicide film. That is to say, the control and floating gate electrodes of each storage element in the first active region do not have their upper surface silicided. Accordingly, the control and floating gate electrodes will not be short-circuited with each other. In addition, the upper surface of the first active region, or the memory circuit region, is not silicided. Thus, in forming contacts to electrically connect the first source/drain regions to external members, a decreased mask overlay margin is allowed, so the first active region can be downsized drastically. As a result, a semiconductor memory, including storage and logic elements for memory and logic circuits on the same semiconductor substrate, can have its size reduced considerably and its performance enhanced greatly.

A second inventive semiconductor memory includes: a control gate electrode formed over a first active region of a semiconductor substrate with a control gate insulating film interposed therebetween; and a floating gate electrode formed adjacent to a side face of the control gate electrode and over the first active region. A capacitive insulating film is interposed between the side face of the control gate electrode and the floating gate electrode, while a tunnel insulating film is interposed between the first active region and the floating gate electrode. The memory further includes: first source/drain regions defined in parts of the first active region beside the control and floating gate electrodes, respectively; and a gate electrode formed over a second active region of the substrate with a gate insulating film interposed therebetween. The second active region is electrically isolated from the first active region. The memory further includes second source/drain regions defined in respective parts of the second active region beside the gate electrode. In this memory, only the first and second source/drain regions and the gate electrode have their upper surface covered with a metal silicide film.

The second inventive memory also achieves the effects of the first inventive memory. In addition, the control and floating gate electrodes of each storage element in the first active region do not have their upper surface silicided. Accordingly, the control and floating gate electrodes will not be short-circuited with each other. However, the upper surface of the first source/drain regions in the first active region has been silicided. Thus, the contact resistance of these regions can be reduced.

In one embodiment of the first or second inventive memory, the substrate preferably has a step, which is located under, and covered with, the floating gate electrode. Then, in writing data, hot electrons, existing in a channel region formed under the control gate electrode, can be injected into the floating gate electrode much more efficiently.

A first inventive method for fabricating a semiconductor memory includes the step of a) partitioning the principal surface of a semiconductor substrate into first and second active regions by forming an isolation film in the principal surface. The method further includes the step of b) forming a first insulating film and a first conductor film in this order over the first and second active regions. The method further includes the step of c) selectively etching away parts of the first conductor and first insulating films, which have been located over the first active region, thereby forming a control gate insulating film and a control gate electrode out of the first insulating and first conductor films, respectively, over the first active region. The method further includes the step of d) forming a second insulating film and a second conductor film in this order over the first active region as well as over the control gate electrode. The method further includes the step of e) etching back the second insulating and second conductor films, thereby forming a floating gate electrode out of the second conductor film adjacently to a side face of the control gate electrode with the second insulating film interposed therebetween. The method further includes the step of f) selectively etching away parts of the first conductor and first insulating films, which have been located over the second active region, thereby forming a gate insulating film and a gate electrode out of the first insulating and first conductor films, respectively, over the second active region. The method further includes the step of g) defining first source/drain regions in parts of the first active region beside the control and floating gate electrodes, respectively. The method further includes the step of h) defining second source/drain regions in respective parts of the second active region beside the gate electrode. And the method further includes the step of i) depositing a passivation film over the first active region and then siliciding the respective upper surfaces of the second source/drain regions and the gate electrode using the passivation film as a mask.

According to the first inventive method, the control and floating gate electrodes and first source/drain regions of each storage element in the first active region do not have their upper surface silicided. Accordingly, the control and floating gate electrodes will not be short-circuited with each other. In addition, the upper surface of the first active region, or the memory circuit region, is not silicided, either. Thus, in forming contacts to electrically connect the first source/drain regions to external members, a decreased mask overlay margin is allowed, so the first active region can be downsized drastically. As a result, a semiconductor memory, having the first and second active regions as memory and logic circuit regions on the same semiconductor substrate, can have its size reduced considerably and its performance enhanced greatly.

A second inventive method for fabricating a semiconductor memory includes the step of a) partitioning the principal surface of a semiconductor substrate into first and second active regions by forming an isolation film in the principal surface. The method further includes the step of b) forming a first insulating film and a first conductor film in this order over the first and second active regions. The method further includes the step of c) selectively etching away parts of the first conductor and first insulating films, which have been located over the first active region, thereby forming a control gate insulating film and a control gate electrode out of the first insulating and first conductor films, respectively, over the first active region. The method further includes the step of d) forming a second insulating film and a second conductor film in this order over the first active region as well as over the control gate electrode. The method further includes the step of e) etching back the second insulating and second conductor films, thereby forming a floating gate electrode out of the second conductor film adjacently to a side face of the control gate electrode with the second insulating film interposed therebetween. The method further includes the step of f) selectively etching away parts of the first conductor and first insulating films, which have been located over the second active region, thereby forming a gate insulating film and a gate electrode out of the first insulating and first conductor films, respectively, over the second active region. The method further includes the step of g) defining first source/drain regions in parts of the first active region beside the control and floating gate electrodes, respectively. The method further includes the step of h) defining second source/drain regions in respective parts of the second active region beside the gate electrode. And the method further includes the step of i) depositing a passivation film over the control and floating gate electrodes and then siliciding the respective upper surfaces of the first and second source/drain regions and the gate electrode using the passivation film as a mask.

According to the second inventive method, the control and floating gate electrodes of each storage element in the first active region do not have their upper surface silicided. Accordingly, the control and floating gate electrodes will not be short-circuited with each other. However, the upper surface of the first source/drain regions in the first active region is silicided. Thus, the contact resistance of these regions can be reduced.

In one embodiment, the first or second inventive method preferably further includes the step of forming a step at part of the surface of the substrate, where the floating gate electrode will be formed, between the steps c) and d) so that the step extends along the width of the control gate electrode.

In another embodiment of the first or second inventive method, the step h) of defining the second source/drain regions is preferably performed after the step g) of defining the first source/drain regions has been performed. Then, the second source/drain regions can be defined to have a junction shallower than that of the first source/drain regions. Accordingly, the elements in the second active region (i.e., the logic circuit region) can have their performance further enhanced. As a result, a split-gate semiconductor memory of even higher performance is realized.

In still another embodiment of the first or second method, the step i) of forming the passivation film may include covering the gate electrode as well with the passivation film. And the method may further include the step of forming a sidewall insulating film on the gate electrode out of parts of the passivation film that are located on the side faces of the gate electrode. Then, the process step of forming a sidewall insulating film over each element in the second active region can be omitted and the fabrication process can be simplified.

BRIEF DESCRIPTION OF THE DRAWINGS

FIGS. 5A through 5C are cross-sectional views illustrating three process steps for fabricating a split-gate semiconductor memory according to a second modified example of the embodiment shown in FIG. 1.

DESCRIPTION OF THE PREFERRED EMBODIMENTS

Hereinafter, an embodiment of the present invention will be described with reference to FIG. 1.

Figure 1:
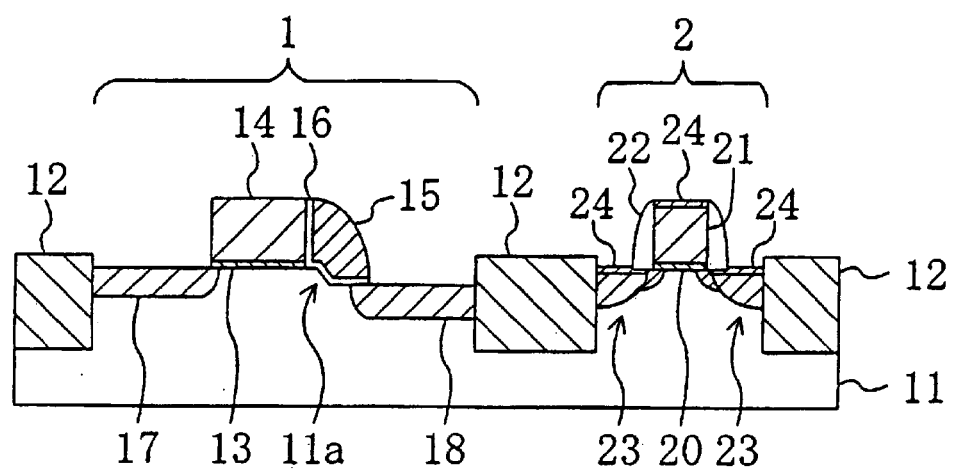
FIG. 1 is a cross-sectional view schematically illustrating a structure for a split-gate semiconductor memory according to an embodiment of the present invention.

FIG. 1 illustrates a cross-sectional structure for a semiconductor memory according to an embodiment of the present invention. The semiconductor memory of this embodiment may be formed either on a semiconductor substrate 11 of silicon or on a silicon layer deposited on an insulating substrate. The substrate 11 is partitioned by an isolation film 12 of silicon dioxide with a shallow trench isolation (STI) structure, for example, into memory and logic circuit regions 1 and 2.

On the memory circuit region 1 of the substrate 11, a control gate electrode 14 has been formed with a control gate insulating film 13 interposed therebetween. As shown in FIG. 1, the surface of the substrate 11 has a step 11a in the memory circuit region 1. And on the side face of the control gate electrode 14 closer to the step 11a, a floating gate electrode 15 has been formed to cover the step 11a with an insulating film 16 interposed therebetween. Part of the insulating film 16, located between the control and floating gate electrodes 14 and 15, serves as a capacitive insulating film, while the other part of the insulating film 16, located between the floating gate electrode 15 and substrate 11, serves as a tunnel insulating film. Source/drain regions 17 and 18 have been defined in parts of the substrate 11 beside the control and floating gate electrodes 14 and 15, respectively. The source/drain regions 17 and 18 are equivalent to the first source/drain regions as defined in the appended claims.

On the logic circuit region 2 of the substrate 11, a gate electrode 21 has been formed with a gate insulating film 20 interposed therebetween. A sidewall insulating film 22 has been formed on the side faces of the gate electrode 21. Source/drain regions 23 have been defined in respective parts of the substrate 11 beside the gate electrode 21. The source/drain regions 23 are equivalent to the second source/drain regions as defined in the claims. And parts of the gate electrode 21 and source/drain regions 23, which would be exposed otherwise, are covered with a metal silicide film 24 containing cobalt or tungsten, for example.

As can be seen, the semiconductor memory of this embodiment has the memory and logic circuit regions 1 and 2 on the same substrate. Each storage element formed in the memory circuit region 1 is a split-gate EEPROM in which the control and floating gate electrodes 14 and 15 are horizontally adjacent to each other on the substrate 11 with the insulating film 16 interposed therebetween and both face the substrate 11. Also, under the floating gate electrode 15, the substrate 11 has the step 11a, which extends in the gate width direction and which is covered with the floating gate electrode 15. Thanks to the existence of the step 11a, hot electrons, which have been created in part of the substrate 11 under the control gate electrode 14, can be injected into the floating gate electrode 15 much more efficiently.

In the semiconductor memory of this embodiment, no exposed parts of the control and floating gate electrodes 14 and 15 are silicided in the memory circuit region 1. Accordingly, the metal silicide film 24 will not short-circuit the control and floating gate electrodes 14 and 15 together. In addition, each logical element (i.e., MOS transistor in this case) in the logic circuit region 2 has its upper surface silicided, and can have its resistance reduced. As a result, the transistor can operate faster.

Furthermore, in forming contacts over the source/drain regions 17 and 18 in the memory circuit region 1 to electrically connect the source/drain regions 17 and 18 to external members, a decreased mask overlay margin may be allowed for a photolithographic process. This is because the surface of the source/drain regions 17 and 18 is not silicided. As a result, the memory circuit region 1 can be downsized. Accordingly, a split-gate semiconductor memory of the type having the memory and logic circuit regions 1 and 2 on the same substrate can be formed just as designed with the size of the memory circuit reduced drastically and with the performance of the logic circuit enhanced greatly.

Hereinafter, it will be described with reference to FIGS. 2A through 2I how to fabricate the semiconductor memory shown in FIG. 1.

FIGS. 2A through 2I illustrate respective process steps for fabricating the semiconductor memory shown in FIG. 1.

Figure 2A:
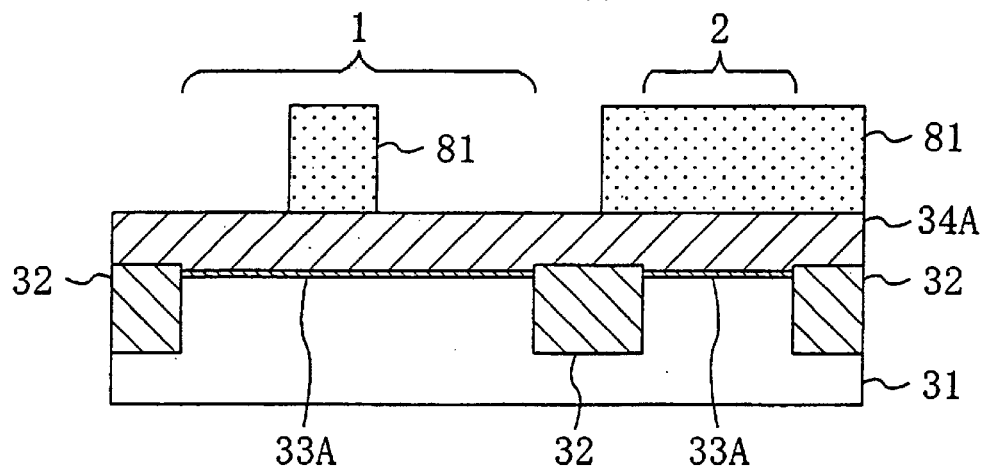
FIGS. 2A through 2I are cross-sectional views illustrating respective process steps for fabricating the split-gate semiconductor memory shown in FIG. 1.

First, as shown in FIG. 2A, trenches are formed to a depth of about 300 nm in the upper part of a semiconductor substrate 31 of silicon. Then, the trenches are filled in with silicon dioxide, thereby forming an isolation film 32 and partitioning the substrate 31 into memory and logic circuit regions 1 and 2, which are equivalent to the first and second active regions as defined in the claims. Thereafter, the principal surface of the substrate 31 is thermally oxidized to form a first insulating film 33A of silicon dioxide with a thickness of about 10 nm. Subsequently, a polysilicon film is deposited by an LPCVD process to a thickness of about 200 nm over the first insulating film 33A.

Then, phosphorus (P) ions are implanted into the polysilicon film at a dose of about $2 \times 10^{15}$ cm$^{-2}$ and at an accelerated voltage of about 10 keV. Next, the doped polysilicon film is annealed at about 800° C. for 15 minutes within a nitrogen ambient, for example, thereby turning the polysilicon film into a first conductor film 34A. Thereafter, a first resist pattern 81 is defined by a photolithographic process on the first conductor film 34A to cover a region where a control gate electrode will be formed.

Figure 2B:
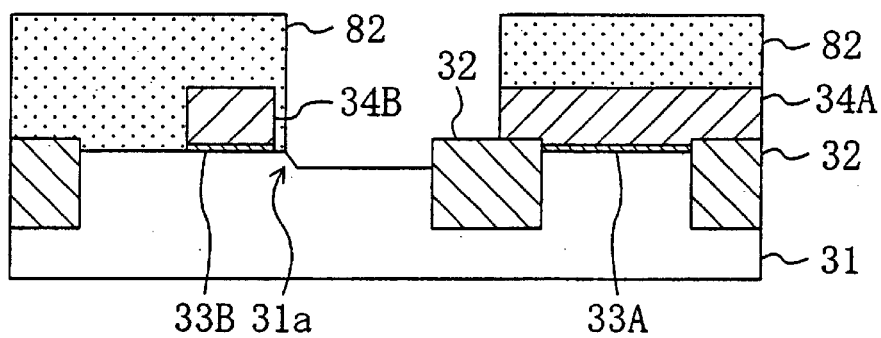

Next, the first conductor and first insulating films 34A and 33A are dry-etched anisotropically using the first resist pattern 81 as a mask. In this manner, a control gate insulating film 33B and a control gate electrode 34B are formed in the memory circuit region 1 out of the first insulating film 33A and first conductor film 34A, respectively, as shown in FIG. 2B. Thereafter, the first resist pattern 81 is removed and instead a second resist pattern 82 is defined by a photolithographic process over the principal surface of the substrate 31. The second resist pattern 82 is defined to form a step at part of the surface of the substrate 31 in the memory circuit region 1. The step should be spaced apart from one side face of the control gate electrode 34B closer to the drain region to be defined and should extend in the gate width direction. So the second resist pattern 82 has an opening over the region where the drain region will be defined. Subsequently, using the second resist pattern 82 as a mask, the surface of the substrate 31 is dry-etched isotropically, thereby forming a step 31a with a depth of about 30 nm in the upper part of the substrate 31.

Figure 2C:
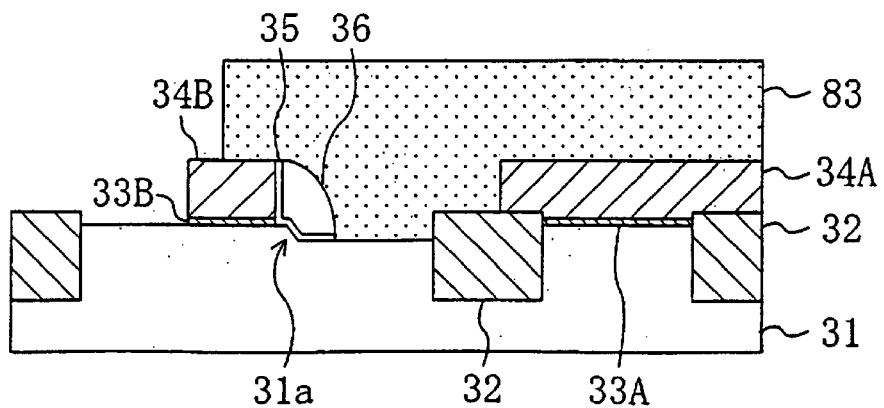

Next, as shown in FIG. 2C, the second resist pattern 82 is removed. Then, the memory circuit region 1 of the substrate 31, as well as the surfaces of the control gate electrode 34B, is thermally oxidized, thereby forming a second insulating film 35 of silicon dioxide thereon. Thereafter, a second conductor film of conductive polysilicon, containing an n-type dopant at about $1 \times 10^{20}$ cm$^{-3}$, is deposited by an LPCVD process to a thickness of about 100 nm. Subsequently, the second conductor film and second insulating film 35 deposited are dry-etched anisotropically and etched back to a depth of about 110 nm, thereby forming a sidewall film of the conductive polysilicon on the sidewall of the control gate electrode 34B. Thereafter, a third resist pattern 83 for forming a floating gate electrode is defined by a photolithographic process. Then, using the third resist pattern 83 as a mask, respective parts of the sidewall film and second insulating film 35 on the other side of the control gate electrode 34B, i.e., opposite to the step 31a, are dry-etched away anisotropically. In this manner, a floating gate electrode 36 is formed on the second insulating film 35 so as to cover the step 31a.

In this case, part of the second insulating film 35 facing the control gate electrode 34B serves as a capacitive insulating film, while the other part of the second insulating film 35 facing the substrate 31 serves as a tunnel insulating film.

Figure 2D:
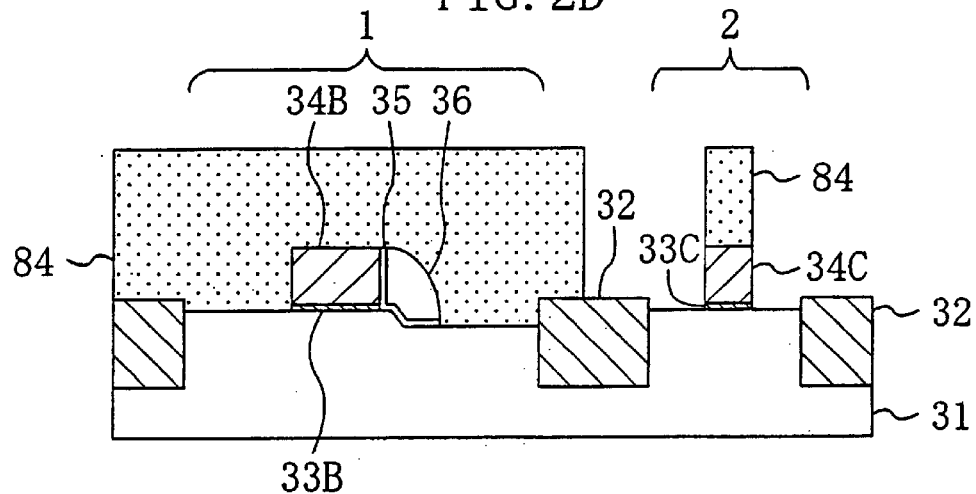

Next, as shown in FIG. 2D, the third resist pattern 83 is removed. Instead, a fourth resist pattern 84 is defined by a photolithographic process to cover part of the first conductor film 34A in the logic circuit region 2 where a gate electrode will be formed. Subsequently, using the fourth resist pattern 84 as a mask, the first conductor film 34A and first insulating film 33A are dry-etched anisotropically. In this manner, a gate insulating film 33C and a gate electrode 34C are formed in the logic circuit region 2 out of the first insulating film 33A and first conductor film 34A, respectively.

Figure 2E:
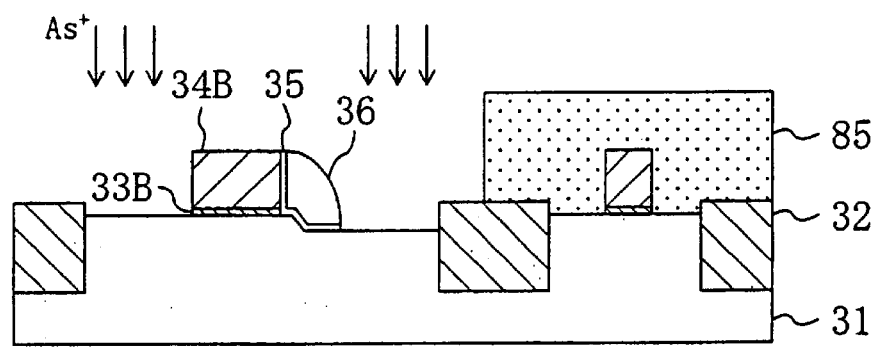

Thereafter, as shown in FIG. 2E, the fourth resist pattern 84 is removed. Instead, a fifth resist pattern 85, covering the logic circuit region 2, is defined by a photolithographic process. Then, using the fifth resist pattern 85 as a mask for the logic circuit region 2 and the control and floating gate electrodes 34B and 36 as a mask for the memory circuit region 1, respectively, arsenic (As$^+$) ions are implanted into the substrate 31.

Figure 2F:
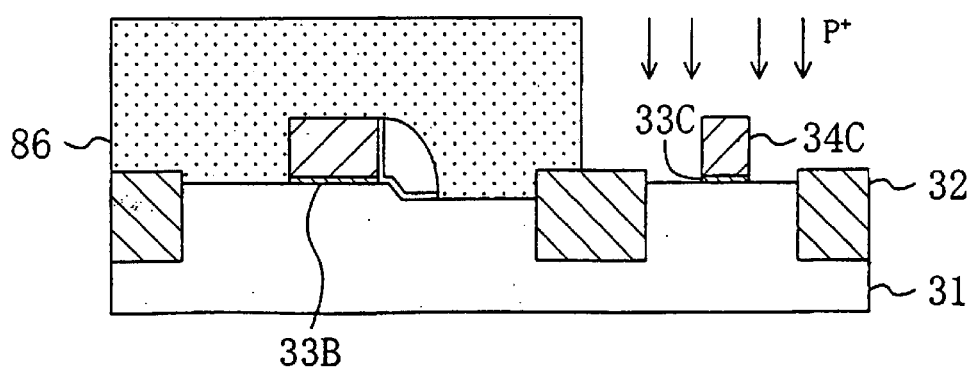

Subsequently, as shown in FIG. 2F, the fifth resist pattern 85 is removed. Instead, a sixth resist pattern 86, covering the memory circuit region 1 this time, is defined by a photolithographic process. Then, using the sixth resist pattern 86 as a mask for the memory circuit region 1 and the gate electrode 34C as a mask for the logic circuit region 2, respectively, phosphorus (P$^+$) ions are implanted into the substrate 31.

Figure 2G:
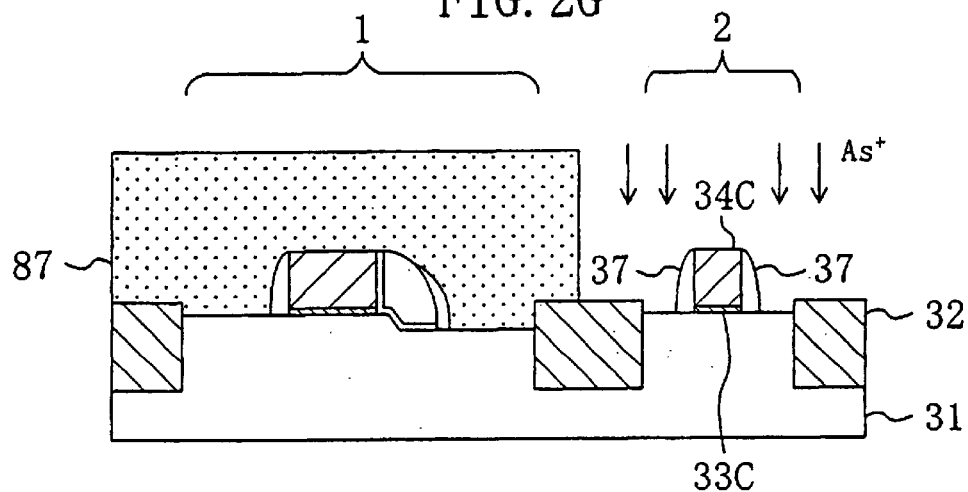

Next, as shown in FIG. 2G, the sixth resist pattern 86 is removed and then a silicon dioxide film is deposited by an LPCVD process to a thickness of about 100 nm over the entire surface of the substrate 31. Thereafter, the silicon dioxide film deposited is etched back to a depth of about 110 nm, thereby forming a sidewall insulating film 37 of silicon dioxide on the gate electrode 34C. Then, a seventh resist pattern 87, covering the memory circuit region 1, is defined by a photolithographic process. Subsequently, using the seventh resist pattern 87 as a mask for the memory circuit region 1 and the gate electrode 34C and sidewall insulating film 37 as a mask for the logic circuit region 2, respectively, arsenic (As$^+$) ions are further implanted into the substrate 31.

Figure 2H:
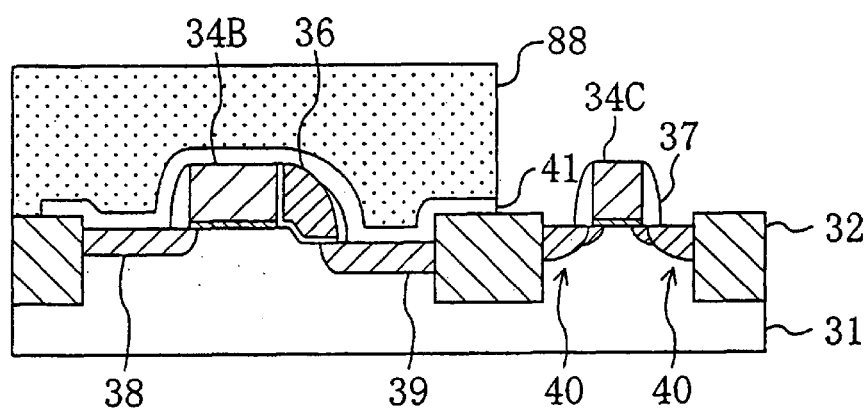

Thereafter, as shown in FIG. 2H, the seventh resist pattern 87 is removed, and then the substrate 31 is annealed at about 800–850° C. for about 60 minutes, thereby activating the dopant ions implanted. In this manner, source/drain regions 38 and 39 are defined in parts of the memory circuit region 1 of the substrate 31 beside the control and floating gate electrodes 34B and 36, respectively. At the same time, source/drain regions 40 are defined in respective parts of the logic circuit region 2 of the substrate 31 beside the gate electrode 34C. Thereafter, a passivation film 41 of silicon dioxide is deposited by an LPCVD process to a thickness of about 40 nm over the substrate 31. The passivation film 41 is formed to prevent the memory circuit region 1 from being silicided. Subsequently, an eighth resist pattern 88, covering part of the passivation film 41 in the memory circuit region 1, is defined by a photolithographic process. Then, using the eighth resist pattern 88 as a mask, the other part of the passivation film 41, covering the logic circuit region 2, is etched away to a depth of about 45 nm. This depth is the sum of the thickness (i.e., 40 nm) of the passivation film 41 and about 10% over-etch depth. In this process step, the passivation film 41 is over-etched so that no etching residue is left.

Figure 2I:
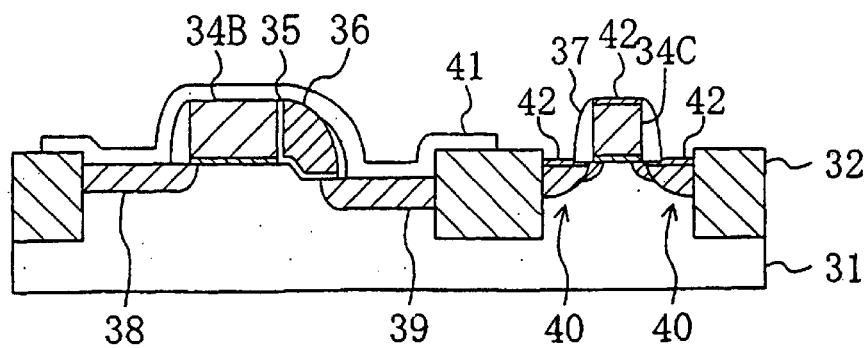

Next, as shown in FIG. 2I, the eighth resist pattern 88 is removed and then a metal film of tungsten or cobalt, for example, is deposited over the substrate 31 by an evaporation or sputtering process, for example. Subsequently, the metal film that has been deposited over exposed silicon portions is silicided, thereby forming a metal silicide film 42 by a self-aligned silicide (salicide) process. Thereafter, the passivation film 41 is removed and then the remaining structure is subjected to the steps of forming metal interconnects, passivation film and bonding pads (none-of which is shown), thereby completing the semiconductor memory shown in FIG. 1.

As described above, in the method of this embodiment, the control and floating gate electrodes 34B and 36 in the memory circuit region 1 are not silicided, thus preventing the control and floating gate electrodes 34B and 36 from being shortcircuited. Accordingly, a split-gate semiconductor memory can be fabricated by utilizing the normal process of forming the memory and logic circuits on the same substrate, and yet can have its size reduced drastically and its performance enhanced greatly at a time.

In the drawings, just one element is shown for each of the memory and logic circuit regions 1 and 2 for illustrative purposes only. Actually, though, a huge number of elements with the illustrated structure are formed in each of these regions 1 and 2.

MODIFIED EXAMPLE 1

Hereinafter, a first modified example of the embodiment shown in FIG. 1 will be described with reference to the accompanying drawings.

Figure 3:
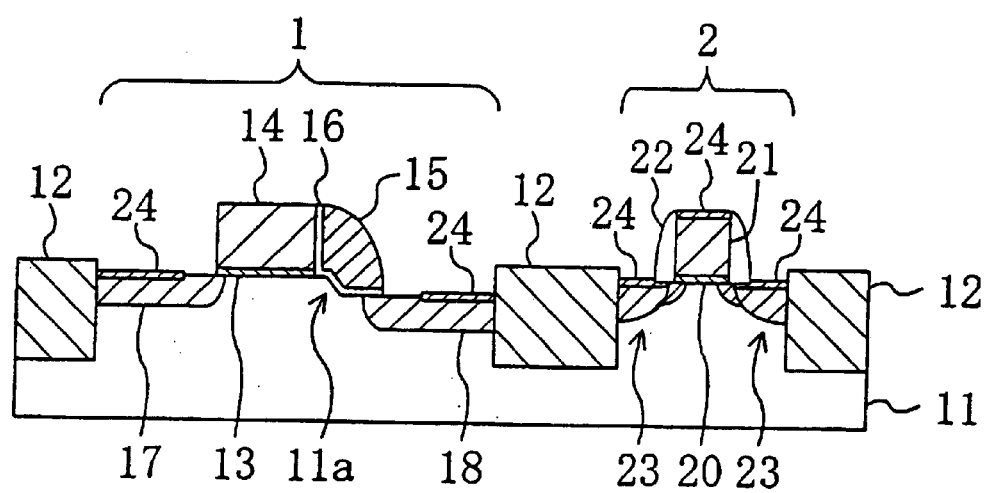
FIG. 3 is a cross-sectional view schematically illustrating a structure for a semiconductor memory according to a first modified example of the embodiment shown in FIG. 1.

FIG. 3 illustrates a cross-sectional structure for a semiconductor memory according to a first modified example of the embodiment shown in FIG. 1. In FIG. 3, each member also shown in FIG. 1 is identified by the same reference numeral and the description thereof will be omitted herein.

In the semiconductor memory of the modified example shown in FIG. 3, the metal silicide film 24 also covers the respective upper surfaces of the source/drain regions 17 and 18 in the memory circuit region 1. However, the exposed parts of the control and floating gate electrodes 14 and 15 are not silicided. Accordingly, the control and floating gate electrodes 14 and 15 will not be short-circuited via the metal silicide film 24, either. Thus, even though memory and logic circuits have been formed on the same substrate, the logic circuit can also operate faster by utilizing the silicidation technique.

In addition, the upper surface of the source/drain regions 17 and 18 in the memory circuit region 1 is covered with the metal silicide film 24 in this modified example. Accordingly, the source/drain regions 17 and 18 can have their contact resistance reduced and the memory circuit can operate faster. As a result, the memory and logic circuits can be formed on the same substrate just as intended and can also have their performance enhanced.

Hereinafter, it will be described with reference to FIGS. 4A and 4B how to fabricate the semiconductor memory of the first modified example.

Figure 4A:
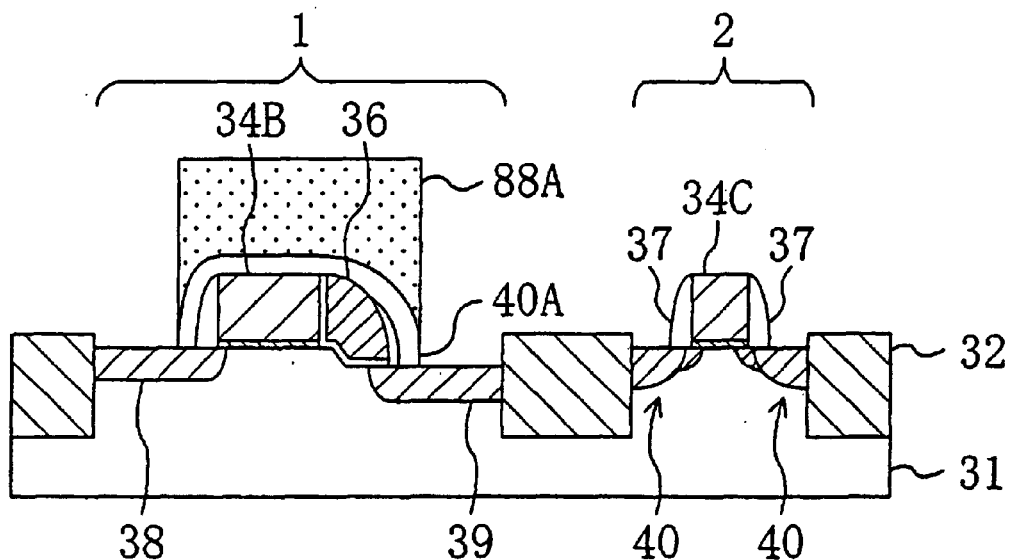
FIGS. 4A and 4B are cross-sectional views illustrating two process steps for fabricating the split-gate semiconductor memory shown in FIG. 3.
Figure 4B:
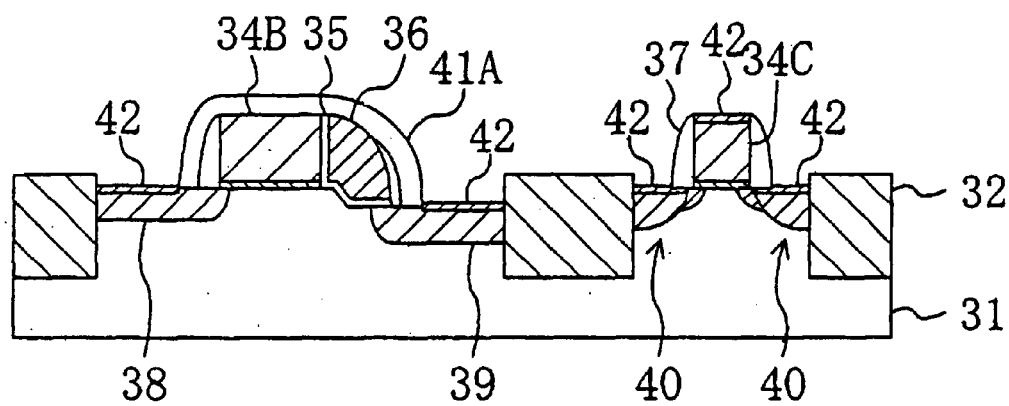

FIGS. 4A and 4B illustrate cross-sectional structures corresponding to two of the process steps for fabricating the semiconductor memory of the first modified example. The process steps shown in FIGS. 4A and 4B are alternatives to the counterparts shown in FIGS. 2H and 2I, respectively. In the following description of this modified example, only the difference between the embodiment shown in FIG. 1 and this modified example will be detailed.

As shown in FIG. 4A, after the seventh resist pattern 87 has been removed, the substrate 31 is annealed at about 850° C. for about 60 minutes, thereby activating the dopant ions implanted. In this manner, source/drain regions 38 and 39 are defined in parts of the memory circuit region 1 of the substrate 31 beside the control and floating gate electrodes 34B and 36, respectively. At the same time, source/drain regions 40 are defined in respective parts of the logic circuit region 2 of the substrate 31 beside the gate electrode 34C.

Thereafter, a passivation film 41A of silicon dioxide is deposited by an LPCVD process to a thickness of about 40 nm over the substrate 31. The passivation film 41A is formed to prevent the control and floating gate electrodes 34B and 36 from being silicided. Subsequently, an eighth resist pattern 88A, covering part of the passivation film 41A over the control and floating gate electrodes 34A and 36, is defined by a photolithographic process. Then, using the eighth resist pattern 88A as a mask, the other exposed part of the passivation film 41A is etched away to a depth of about 45 nm. This depth is the sum of the thickness (i.e., 40 nm) of the passivation film 41A and about 10% over-etch depth. In this process step, the passivation film 41A is over-etched so that no etching residue is left.

Next, as shown in FIG. 4B, the eighth resist pattern 88A is removed and then a metal film of tungsten or cobalt, for example, is deposited over the substrate 31 by an evaporation or sputtering process, for example. Subsequently, the metal film that has been deposited over exposed silicon portions is silicided, thereby forming a metal silicide film 42 by a salicide process. Thereafter, the passivation film 41A is removed and then the remaining structure is subjected to the steps of forming metal interconnects, passivation film and bonding pads (none of which is shown), thereby completing the semiconductor memory shown in FIG. 3.

As described above, in this modified example, the control and floating gate electrodes 34B and 36 are not silicided in the memory circuit region 1. Accordingly, these electrodes 34B and 36 will not be short-circuited via the metal silicide film 24, either. Thus, the semiconductor memory is implementable as a split-gate memory with enhanced performance even though the memory and logic circuit regions 1 and 2 have been defined on the same substrate. In addition, the upper surface of the source/drain regions 38 and 39 in the memory circuit region 1 is covered with the metal silicide film 42 in this modified example. Accordingly, the source/drain regions 38 and 39 can have their contact resistance reduced and the memory circuit can also operate faster.

MODIFIED EXAMPLE 2

Hereinafter, it will be described with reference to FIGS. 5A through 5C how to fabricate a semiconductor memory according to a second modified example of the embodiment shown in FIG. 1.

FIGS. 5A through 5C illustrate cross-sectional structures corresponding to three of the process steps for fabricating the semiconductor memory of the second modified example. The process steps shown in FIGS. 5A through 5C are alternatives to the counterparts shown in FIGS. 2F and 2G. In the following description of this modified example, only the difference between the embodiment shown in FIG. 1 and this modified example will be detailed.

In the second modified example, before dopant ions are implanted into the logic circuit region 2, the dopant, which has been introduced into the memory circuit region 1 to define the source/drain regions 38 and 39 there, is activated through annealing as shown in FIG. 5A. Thereafter, the dopant introduced into the logic circuit region 2 to define the source/drain regions 40 there will be activated separately.

Specifically, after the fifth resist pattern 85 shown in FIG. 2E has been removed, the substrate 31 is annealed at about 850° C. for about 60 minutes, thereby activating the arsenic ions that have been implanted into the memory circuit region 1 of the substrate 31. In this manner, source/drain regions 38 and 39 with a junction depth of about 0.3 $\mu$m are defined in parts of the memory circuit region 1 of the substrate 31 beside the control and floating gate electrodes 34B and 36, respectively. Thereafter, a sixth resist pattern 86, covering the memory circuit region 1, is defined by a photolithographic process. Then, using the sixth resist pattern 86 as a mask for the memory circuit region 1 and the gate electrode 34C as a mask for the logic circuit region 2, respectively, phosphorus (P$^+$) ions are implanted into the substrate 31.

Next, as shown in FIG. 5B, the sixth resist-pattern 86 is removed and then a silicon dioxide film is deposited by an LPCVD process to a thickness of about 100 nm over the substrate 31. Thereafter, the silicon dioxide film deposited is etched back to a depth of about 110 nm, thereby forming a sidewall insulating film 37 of silicon dioxide on the gate electrode 34C. Then, a seventh resist pattern 87, covering the memory circuit region 1, is defined by a photolithographic process. Subsequently, using the seventh resist pattern 87 as a mask for the memory circuit region 1 and the gate electrode 34C and sidewall insulating film 37 as a mask for the logic circuit region 2, respectively, arsenic (As$^+$) ions are further implanted into the substrate 31.

Next, as shown in FIG. 5C, the seventh resist pattern 87 is removed. Then, the substrate is subjected to a rapid thermal annealing (RTA) process at about 1000° C. for about 10 seconds, thereby activating the phosphorus and arsenic ions that have been implanted into the logic circuit region 2 of the substrate 31. In this manner, source/drain regions 40A with a junction depth of about 0.15 μm are defined in respective parts of the logic circuit region 2 of the substrate 31 beside the gate electrode 34C.

Thereafter, the exposed silicon portions in the logic circuit region 2 may be silicided as in the embodiment shown in FIG. 2I. Optionally, the exposed silicon portions in the source/drain regions 38 and 39 of the memory circuit region 1 may also be silicided as in the first modified example.

As described above, according to the second modified example, after the source/drain regions 38 and 39 have been defined in the memory circuit region 1 in one process step, the source/drain regions 40A are defined in the logic circuit region 2 in another process step. Accordingly, the source/drain regions 40A in the logic circuit region 2 can have a shallower junction. As a result, the elements in the logic circuit region 2 can operate faster and a split-gate semiconductor memory with such a configuration realizes even higher performance.

MODIFIED EXAMPLE 3

Hereinafter, it will be described with reference to FIGS. 6A through 6C how to fabricate a semiconductor memory according to a third modified example of the embodiment shown in FIG. 1.

Figure 6A:
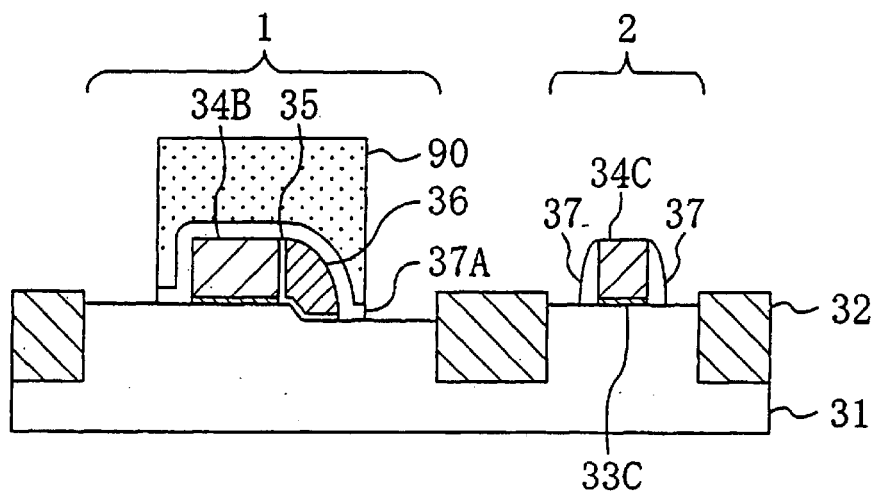
FIGS. 6A through 6C are cross-sectional views illustrating three process steps for fabricating a split-gate semiconductor memory according to a third modified example of the embodiment shown in FIG. 1.
Figure 6B:
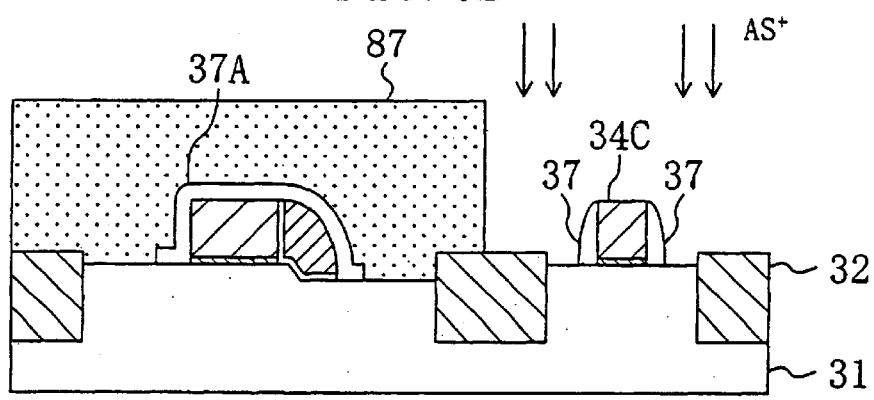
Figure 6C:
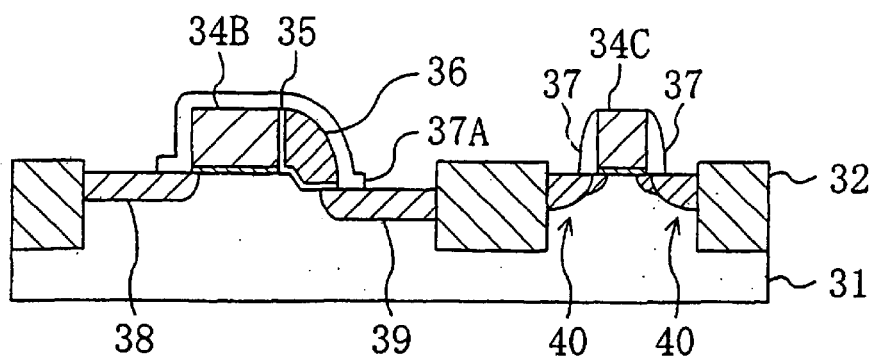
Figure 7:
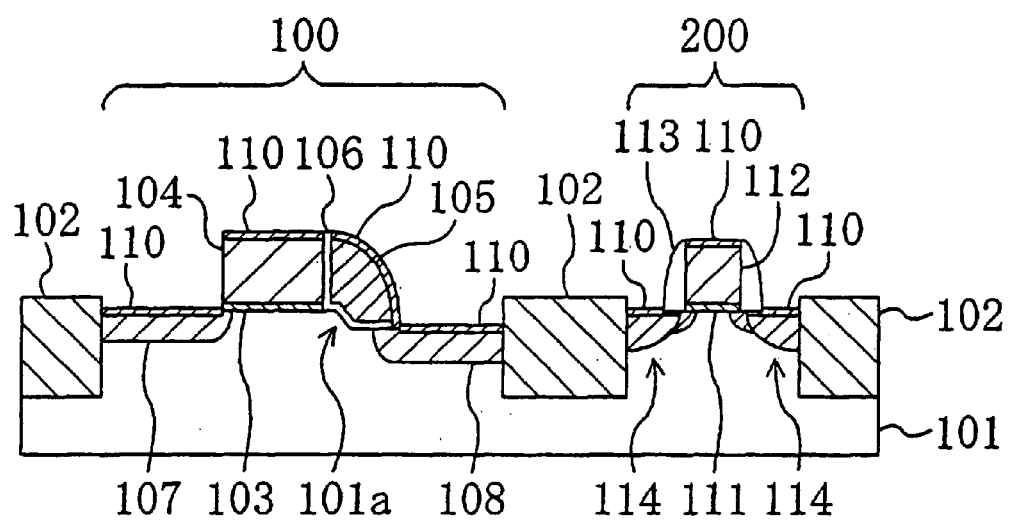
FIG. 7 is a cross-sectional view schematically illustrating a structure for a known split-gate semiconductor memory.

FIGS. 6A through 6C illustrate cross-sectional structures corresponding to three of the process steps for fabricating the semiconductor memory of the third modified example. The process steps shown in FIGS. 6A through 6C are alternatives to the counterparts shown in FIGS. 2G through 2I. In the following description of this modified example, only the difference between the embodiment shown in FIG. 1 and this modified example will be detailed. In the embodiment shown in FIG. 1 and the first and second modified examples thereof, the sidewall insulating film 37 is deposited on the gate electrode 34C in the logic circuit region 2 but is removed and not used in the memory circuit region 1. In this third modified example on the other hand, the insulating film is used not only as a sidewall for the gate electrode 34C but also as a passivation film that prevents the memory circuit from being silicided.

Specifically, after the sixth resist pattern 86 shown in FIG. 2F has been removed, a silicon dioxide film is deposited by an LPCVD process to a thickness of about 100 nm over the substrate 31. Thereafter, as shown in FIG. 6A, a resist pattern 90, covering the control and floating gate electrodes 34B and 36 in the memory circuit region 1, is defined by a photolithographic process. Then, using the resist pattern 90 as a mask, the silicon dioxide film deposited is etched back to a depth of about 110 nm. In this manner, a passivation film 37A of silicon dioxide is formed in the memory circuit region 1, and at the same time, a sidewall insulating film 37 of silicon dioxide is formed on the gate electrode 34C in the logic circuit region 2.

Thereafter, as shown in FIG. 6B, the resist pattern 90 is removed. Instead, a seventh resist pattern 87, covering the memory circuit region 1, is defined by a photolithographic process. Subsequently, using the seventh resist pattern 87 as a mask for the memory circuit region 1 and the gate electrode 34C and sidewall insulating film 37 as a mask for the logic circuit region 2, respectively, arsenic (As$^+$) ions are implanted into the substrate 31.

Next, as shown in FIG. 6C, the seventh resist pattern 87 is removed, and then substrate 31 is annealed at about 850° C. for about 60 minutes, thereby activating the dopant ions implanted. In this manner, source/drain regions 38 and 39 are defined in parts of the memory circuit region 1 of the substrate 31 beside the control and floating gate electrodes 34B and 36, respectively. At the same time, source/drain regions 40 are defined in respective parts of the logic circuit region of the substrate 31 beside the gate electrode 34C.

Thereafter, a metal silicide film 42 is formed on the exposed silicon portions of the source/drain regions 38 and 39 in the memory circuit region 1 and those of the source/drain regions 40 in the logic circuit region 2 by a salicide process.

In the process step shown in FIG. 6A, the resist pattern 90 may also be defined to cover the entire memory circuit region 1. Then, the resultant passivation film 37A will also prevent the source/drain regions 38 and 39 from being silicided.

Also, as in the second modified example, the dopant existing in the source/drain regions 40 of the logic circuit region 2 may be activated by an RTA process separately from the dopant in the source/drain regions 38 and 39 of the memory circuit region 1.

As described above, according to the third modified example, the passivation film 37A for preventing the silicidation of the memory circuit region 1 and the sidewall insulating film 37 for the gate electrode 34C in the logic circuit region 2 can be formed in a single process step. As a result, the fabrication process can be simplified and the cost of the semiconductor memory can be reduced.

What is claimed is:

1. A semiconductor memory comprising:
   a control gate electrode formed over a first active region of a semiconductor substrate with a control gate insulating film interposed between the first active region and the control gate electrode;
   a floating gate electrode formed adjacent to a side face of the control gate electrode and over the first active region, a capacitive insulating film being interposed between the side face of the control gate electrode and the floating gate electrode, a tunnel insulating film being interposed between the first active region and the floating gate electrode;
   first source/drain regions defined in parts of the first active region beside the control and floating gate electrodes, respectively;

a gate electrode formed over a second active region of the substrate with a gate insulating film interposed between the second active region and the gate electrode, the second active region being electrically isolated from the first active region; and second source/drain regions defined in respective parts of the second active region beside the gate electrode, wherein the first and second source/drain regions and the gate electrode have their upper surface covered with a metal silicide film, and the control gate electrode and the floating gate electrode do not have their upper surface covered with a metal silicide film.

2. The memory of claim 1, wherein the substrate has a step under the floating gate electrode, the step being covered with the floating gate electrode.

* * * * *